(12) United States Patent
Passek et al.

(10) Patent No.: US 8,304,860 B2
(45) Date of Patent: Nov. 6, 2012

(54) EPITAXIALLY COATED SILICON WAFER AND METHOD FOR PRODUCING AN EPITAXIALLY COATED SILICON WAFER

(75) Inventors: Friedrich Passek, Adlkofen (DE); Frank Laube, Burghausen (DE); Martin Pickel, Burghausen (DE); Reinhard Schauer, Laufen (DE)

(73) Assignee: Siltronic AG, Munich (DE)

( * ) Notice: Subject to any disclaimer, the term of this patent is extended or adjusted under 35 U.S.C. 154(b) by 277 days.

(21) Appl. No.: 12/658,816

(22) Filed: Feb. 16, 2010

(65) Prior Publication Data

US 2010/0224964 A1   Sep. 9, 2010

(30) Foreign Application Priority Data

Mar. 4, 2009   (DE) .................... 10 2009 011 622

(51) Int. Cl.
*H01L 29/06* (2006.01)

(52) U.S. Cl. ............ 257/618; 257/48; 257/49; 257/706; 257/720; 438/689; 438/692; 438/745; 438/753

(58) Field of Classification Search .................. None
See application file for complete search history.

(56) References Cited

U.S. PATENT DOCUMENTS

| 5,989,105 | A | 11/1999 | Kawakawaguchi et al. |
| 2002/0022351 | A1 | 2/2002 | Schmolke et al. |
| 2002/0066468 | A1 | 6/2002 | Vail et al. |
| 2002/0090818 | A1 | 7/2002 | Thilderkvist et al. |
| 2003/0010280 | A1 * | 1/2003 | Sugihara et al. ................. 117/97 |
| 2003/0186624 | A1 | 10/2003 | Koike et al. |
| 2004/0053515 | A1 | 3/2004 | Comita et al. |
| 2004/0222416 | A1 | 11/2004 | Teuschler et al. |
| 2006/0072105 | A1 | 4/2006 | Wagner |
| 2007/0017900 | A1 | 1/2007 | Rupp et al. |
| 2007/0062438 | A1 | 3/2007 | Schauer et al. |
| 2007/0066036 | A1 | 3/2007 | Schauer et al. |
| 2007/0066082 | A1 | 3/2007 | Schauer et al. |
| 2008/0182397 | A1 | 7/2008 | Lam et al. |
| 2011/0297959 | A1 | 12/2011 | Nakayama et al. |

FOREIGN PATENT DOCUMENTS

| CN | 1518069 A | 8/2004 |
| CN | 1534734 A | 10/2004 |
| CN | 1936110 A | 3/2007 |
| DE | 10352936 A1 | 12/2004 |
| DE | 102005034120 A1 | 2/2007 |
| DE | 102005045337 A1 | 4/2007 |
| DE | 102005045338 A1 | 4/2007 |
| EP | 1348947 A1 | 10/2003 |

* cited by examiner

*Primary Examiner* — Kyoung Lee
(74) *Attorney, Agent, or Firm* — Brooks Kushman P.C.

(57) ABSTRACT

Epitaxially coated silicon wafers have a rounded and polished edge region and a region adjacent to the edge having a width of 3 mm on the front and rear sides, a surface roughness in edge region of 0.1-1.5 nm RMS relative to a spatial wavelength range of 10-80 μm, and a variation of surface roughness of 1-10%. The wafer edges, after polishing, are examined for defects and roughness at the edge and surrounding region. Silicon wafers having a surface roughness of less than 1 nm RMS are pretreated in single wafer epitaxy reactors, first in a hydrogen atmosphere at a flow rate of 1-100 slm and in a second step, an etching medium with a flow rate of 0.5-5 slm is conducted onto the edge region of the wafer by a gas distribution device. The wafer is then epitaxially coated.

20 Claims, 7 Drawing Sheets

○ EBI image brightness front max. (a.u.)
× Roughness Rq (A) 10-80 μm filter
  optical roughness measurement 3 μm

EPITAXIALLY COATED SILICON WAFER AND METHOD FOR PRODUCING AN EPITAXIALLY COATED SILICON WAFER

CROSS-REFERENCE TO RELATED APPLICATIONS

This application claims priority to German Patent Application No. 10 2009 011 622.2 filed Mar. 4, 2009 which is herein incorporated by reference.

BACKGROUND OF THE INVENTION

1. Field of the Invention

The invention relates to an epitaxially coated silicon wafer and a method for producing an epitaxially coated silicon wafer.

2. Background Art

The quality requirements for the edge of a silicon wafer are ever increasing, in particular for large diameter silicon wafers (diameter z 300 mm). In particular, the edge of the silicon wafer should be free of contamination as far as possible and have a low roughness. Moreover, the edge should be resistant to increased mechanical stresses during handling. The untreated edge of a silicon wafer sliced from a single crystal has a comparatively rough and nonuniform surface. It often experiences spalling under mechanical loading and is a source of disturbing particles. It is therefore customary to regrind the edge in order thereby to eliminate spalling and damage in the crystal and to provide it with a specific profile.

Suitable grinding equipment is known from the prior art. It is customary for the silicon wafer to be fixed on a rotating table and for its edge to be moved onto the likewise rotating working surface of a machining tool. The machining tools are generally in the form of disks which are secured to a spindle and have circumferential surfaces serving as working surfaces for machining the edge of the silicon wafer. The material removing abrasive grain is usually securely anchored in the working surfaces of the machining tools. These machining tools are suitable for providing the silicon wafer with a rounded edge. It is usual for a certain minimum roughness to remain on the edge surface after the edge rounding.

In a subsequent machining step, the edge of the silicon wafer, which has been ground and treated with etching medium, is usually polished. In this case, the edge of a centrally rotating silicon wafer is pressed against a centrally rotating polishing drum with a specific force (contact pressure). U.S. Pat. No. 5,989,105 discloses an edge polishing method of this type, in which the polishing drum consists of an aluminum alloy and is covered with a polishing cloth. The silicon wafer is usually fixed on a flat wafer holder, a so called "chuck". The edge of the silicon wafer projects beyond the chuck, such that it is freely accessible to the polishing drum.

For process monitoring, after edge polishing, it is customary for a visual check of the edges of the silicon wafers to be carried out under a microscope on a sample basis. This check is for particles, roughness and defects on the edge of the silicon wafer. In particular, the edge of the silicon wafer is examined for light reflections caused by possible unevennesses. However, this visual check is unreliable and does not allow a uniform edge quality to be ensured for all silicon wafers. Furthermore, the visual check is unsuitable for completely and reliably detecting small defects in the edge region of a silicon wafer in order to draw conclusions as to a possibly defective procedure.

Inspection devices are available, but these generally only allow inspection of the silicon wafer as far as the wafer edge to an edge exclusion zone of 3 mm. Most known inspection apparatuses cannot be used to examine the entire edge region, that is to say both the edge of the silicon wafer and the edge exclusion zone. By way of example, EP 1348947 A1 discloses an inspection apparatus which can be used to inspect the edge of the silicon wafer, but not the entire edge region (edge exclusion). By contrast, DE 10352936 A1 describes an inspection apparatus which allows automatic detection of defects starting from a specific size in the entire edge region including the edge exclusion zone of the silicon wafer.

Previous edge inspection methods do not yield sufficient information to optimize fabrication processes accordingly. In particular, it is not possible to unambiguously differentiate between defects and thus to monitor and avoid the production of critical defects.

SUMMARY OF THE INVENTION

The aim, therefore, must be that of monitoring and thereby improving the fabrication process for epitaxially coated wafers using automatic edge inspection which includes automatic high resolution defect characterization, and, if appropriate, sorting with regard to individual defect types and classes, in order to supply only silicon wafers without the defects identified as undesirable. It was an object of the invention to provide an epitaxially coated silicon wafer having an improved image quality and a suitable method for producing an epitaxially coated silicon wafer.

These and other objects are achieved by providing an epitaxially coated silicon wafer having front and a rear sides, and an edge region comprising a rounded and polished edge of the silicon wafer and also a region adjacent to the edge which has a width of 3 mm on the front and rear sides, characterized by a surface roughness in the edge region of 0.1-1.5 nm RMS relative to a spatial wavelength range of 10-80 μm and also by a variation of the surface roughness of 1-10%. The epitaxially coated silicon wafer is produced by a process comprising the following sequence: (a) providing a group of silicon wafers having rounded edges; (b) polishing the edges of the silicon wafers; (c) cleaning the silicon wafers; (d) examining the edge regions of the group of silicon wafers with regard to defects and edge roughness, wherein the edge region includes the rounded and polished edge of the wafer and also a region adjacent to the edge which has a width of 3 mm on the front and rear sides, and also selecting a silicon wafer from the group of silicon wafers which has a surface roughness of less then 1 nm RMS relative to a spatial wavelength range of 10-80 μm; (e) pretreating the selected silicon wafer in a reactor chamber of a single wafer epitaxy reactor, wherein, in a first step, a treatment in a hydrogen atmosphere at a flow rate of 1-100 slm is effected and, in addition, in a second step, an etching medium with a flow rate of 0.5-5 slm is added to the hydrogen atmosphere and is distributed in the reactor chamber by means of a gas distribution device; and (f) epitaxially coating the silicon wafer.

DETAILED DESCRIPTION OF THE PREFERRED EMBODIMENT(S)

Figure 1:
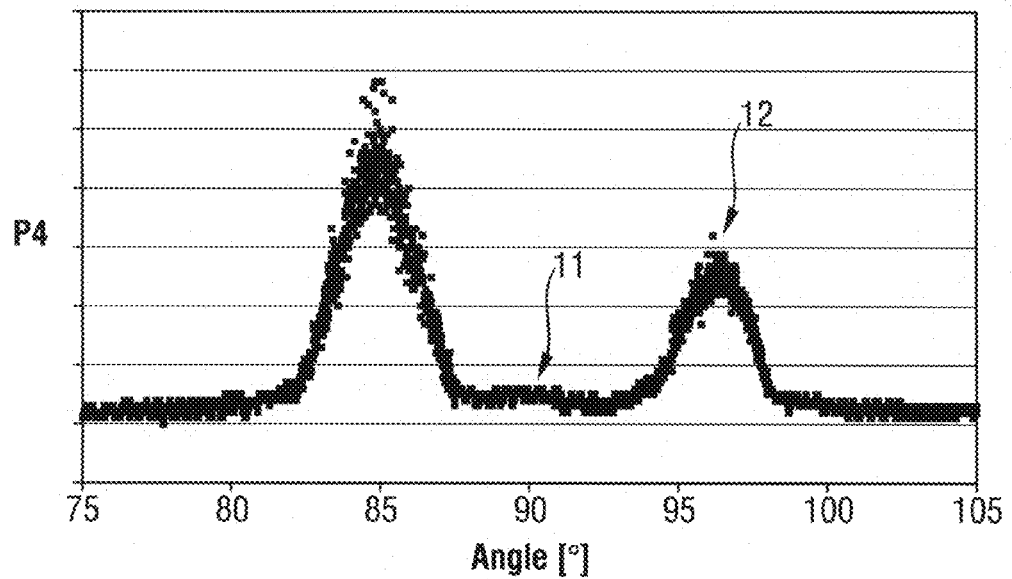
FIG. 1 illustrates the so called P4 parameter as a function of the angle.

In the present invention, the edge region comprises not only the edge of the silicon wafer including all the inclined and rounded surfaces but also an edge region of 3 mm on the front and rear sides, that is to say a ring shaped region that is adjacent to the edge of the silicon wafer and has a width of 3 mm.

In the method of the invention, first, a group of silicon wafers having rounded edges is provided. For this purpose, silicon wafers are sliced from a single crystal, their edges are rounded, and the front and rear sides are planarized by means of grinding and/or lapping methods and possibly subjected to a wet chemical etching treatment.

The rounded edges of the silicon wafers are subsequently polished in accordance with (b). Commercially available automated edge polishing units are available for this purpose. In this case, the silicon wafer is fixed on a centrally rotating chuck, with the wafer edge projecting beyond the chuck. A centrally rotating polishing drum, which is covered with a polishing cloth and inclined by a specific angle with respect to the chuck, and the chuck with the silicon wafer are moved toward one another and pressed onto one another with a specific contact pressure while a polishing agent is continuously supplied.

During edge polishing, the chuck with the silicon wafer is rotated centrally. Preferably, one revolution of the chuck lasts 20-300 s, more preferably 50-150 s (revolution time).

The polishing drum covered with polishing cloth is rotated centrally, preferably at a rotational speed of 300-1500 $min^{-1}$, more preferably 500-1000 $min^{-1}$, and the polishing drum and chuck are moved toward one another, with the polishing drum being set obliquely at a setting angle with respect to the silicon wafer and the silicon wafer being fixed on the chuck in such a way that it projects slightly beyond the chuck and is therefore accessible to the polishing drum. The setting angle is preferably 30-50°.

The silicon wafer and polishing drum are pressed onto one another with a specific contact pressure and with a polishing agent being supplied continuously, preferably with a polishing agent flow rate of 0.1-1 liter/min, more preferably 0.15-0.40 liter/min, wherein the contact pressure can be set by means of weights attached to rolls and is preferably 1-5 kg, more preferably 2-4 kg. Polishing drum and silicon wafer are preferably moved away from one another after 2-20, more preferably after 2-8 revolutions of the silicon wafer or of the chuck holding the silicon wafer.

Example of Edge Polishing:

For an edge polishing machine of the Speedfam EP300 IV type, by way of example the following setting parameters are suitable for carrying out the method according to the invention, that is to say for achieving a specific edge roughness (a preferred range is specified between parentheses):

contact pressure during polishing: 3.0 kg (1.0-5.0 kg)
rotational speed of polishing drum: 800 RPM (300-1500 RPM)
rotational speeds of wafer: 85 sec/revolution (20-300 sec/revolution)
revolutions of the wafer: 4 (2-20 revolutions)
polishing agent flow rate: 300 ml/min (100-1000 ml/min)
polishing agent concentration: e.g. 0.8% $K_2CO_3$ (unimportant, any other concentrations possible)
type of polishing agent: e.g. 5% $SiO_2$ Levasil™ 200 from Bayer, many others are conceivable
setting angle of polishing drum with respect to the wafer: 40° (30-50°)
polishing cloth: e.g. Suba™ 400 from Rohm and Haas Co. or the like (polishing cloths from 3M Inc., Nihon Micro Coating etc.)
polishing duration: 340 sec (150-600 sec)

Preferably, the silicon wafer machined in this way has after edge polishing a rounded, possibly etched (acid or alkaline) and polished, defect free and homogeneous edge.

After edge polishing, the silicon wafers are cleaned in accordance with step c). The cleaning can be effected either as a batch method with simultaneous cleaning of a multiplicity of silicon wafers in baths or using spraying methods or, alternatively, as a single wafer process.

In the context of the invention, it is preferable to carry out, in step c), bath cleaning with simultaneous cleaning of a multiplicity of silicon wafers, for example all the wafers from an edge polishing operation, for example in the sequence cleaning with aqueous hydrofluoric acid (1-IF), rinsing with ultrapure water, cleaning with TMAH/$H_2O_2$ (tetramethylammonium hydroxide/hydrogen peroxide), and rinsing with ultrapure water. Afterward, the silicon wafers are usually dried, which can be effected by means of commercially available apparatuses which operate according to the centrifugal drying, hot water, or HF/ozone principle. The edge polished silicon wafers obtained after the cleaning and drying step are dry and hydrophilic.

During cleaning with HF, preferably an acidic cleaning agent is added, such as e.g. Silapur 50™ available from ICB GmbH & Co. KG, which is distinguished by extremely low concentrations of metal impurities in the low ppb range and is particularly suitable for eliminating metal impurities from silicon surfaces.

Example: 0.012% Silapur (200 ml)+1.25% HF (3100 ml) at a flow rate of 1500 liter/h for 180 sec.

Rinsing with ultrapure water is preferably effected at a flow rate of 1500-2000 l/h for 60-300 sec.

During cleaning with TMAH/$H_2O_2$ the following are suitable, for example: 0.65% TMAH (4710 ml)+1.05% $H_2O_2$ (4610 ml) at 60° C. and flow rate of 1500 l/h for approximately 300 sec.

Figure 4A:
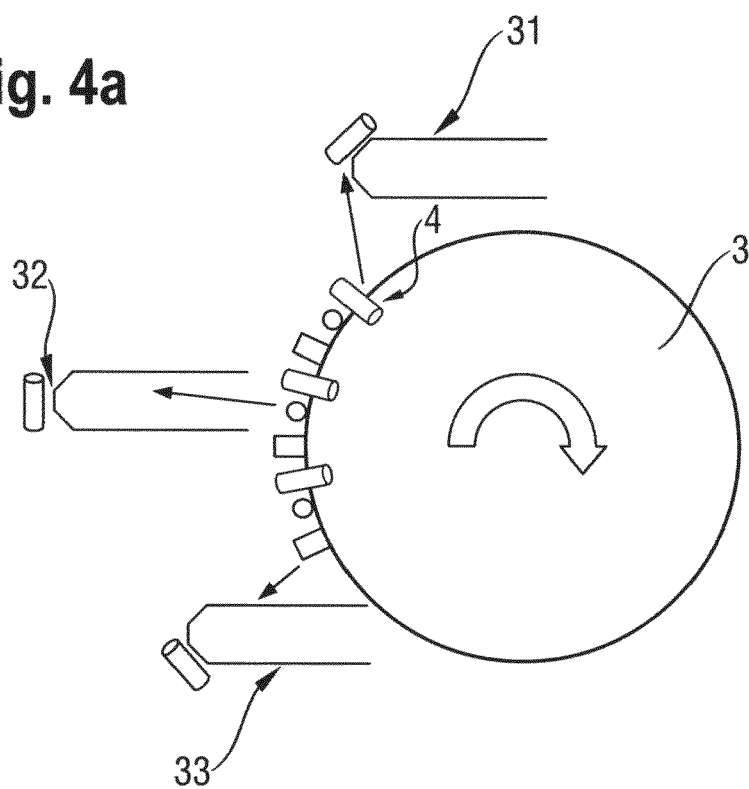
FIG. 4 schematically shows the roller cleaning principle.
Figure 4B:
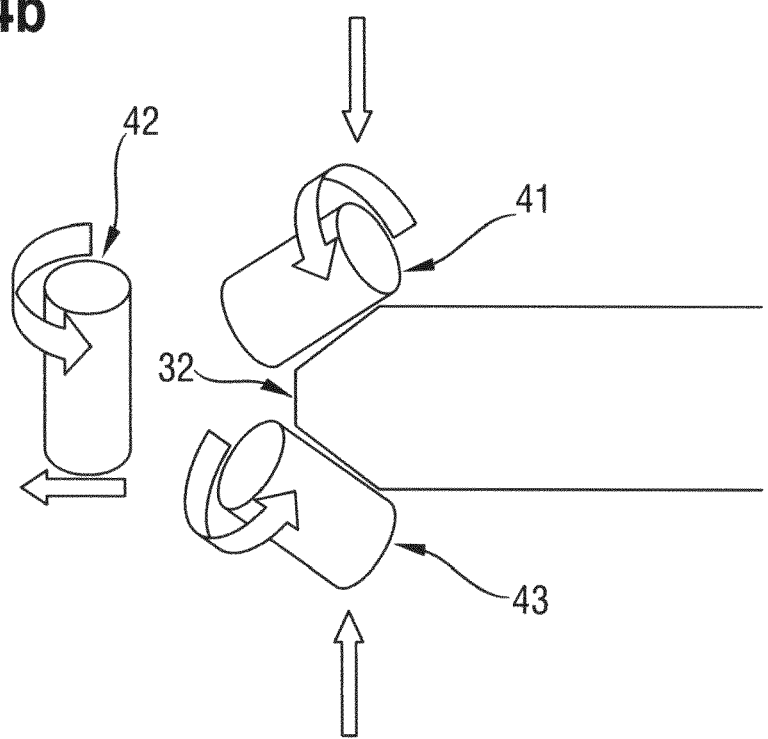

As a result of handling steps and the transport of the wafers in the production line, the wafer edge can be contaminated particularly at the points of contact (e.g. contact locations in transport cassettes). Such contaminations can lead to incorrect growth and defects in the epitaxy process. In order to avoid this, cleaning tailored specifically to the edge of the silicon wafer was developed. Particularly good results were able to be achieved with roller cleaning, and a schematic illustration of a suitable device is illustrated in FIG. 4. In this case, the wafer 3 is moved relative to cleaning rollers 4, the wafer 3 and/or the rollers 4 being flushed with cleaning solution. The cleaning rollers 4 used are preferably synthetic sponges, for example, and preferably are based on polyvinyl alcohol (PVA).

The relative speed between wafer edge (apex 32, edge front side 31 and edge rear side 33) and cleaning rollers 4 is preferably 100-500 cm/min, more preferably 200-300 cm/min. The outermost part of the wafer edge, which is oriented approximately perpendicular to the wafer surface, is designated as the apex 32 (see also FIG. 4B).

Cleaning rollers 4 are used which are
42 in contact with the apex 32,
41 in contact with the front side edge 31, and
43 in contact with the rear side edge 33.

Customary cleaning agents used in silicon technology are preferably employed. Solutions comprising ultrapure water, tetramethylammonium hydroxide (TMAH) and hydrogen peroxide ($H_2O_2$), e.g. in concentrations of 0.3% TMAH+ 0.7% $H_2O_2$, are particularly well suited.

After the bath cleaning, provision is made, in accordance with (d), for examining the edge regions of the group of silicon wafers with regard to defects and edge roughness and also for selecting a silicon wafer from the group of silicon wafers which has a surface roughness of less than 1 nm RMS relative to a spatial wavelength range of 10-80 p.m. Preferably, a silicon wafer is selected comprising a front side, a rear side and an edge region comprising a rounded and polished edge of the silicon wafer and also a region that is adjacent to the edge and has a width of in each case 3 mm on the front and rear sides, characterized by a surface roughness in that edge region of 0.1-0.8 nm RMS relative to a spatial wavelength range of 10-80 μm and also by a variation of the surface roughness of 1-3%. Preferably, the selected silicon wafer furthermore has no defects having a length/size/extent of greater than 1 μm in the edge region.

If a silicon wafer from the group of silicon wafers does not have the requirements for edge roughness, this silicon wafer is either sorted out or reprocessed, namely subjected to a renewed edge polishing. In this case, the process parameters are correspondingly modified on the basis of the results of the examination in order to satisfy the required edge roughness of less than 1 nm RMS relative to a spatial wavelength range of 10-80 μm and more preferably an edge roughness of 0.1-0.9 nm RMS relative to a spatial wavelength range of 10-80 μm.

It is conceivable, for example, for individual silicon wafers from the group of silicon wafers to lie outside the claimed range for the edge roughness on account of process fluctuations. These wafers are correspondingly reprocessed under stable process conditions.

An automatic edge inspection unit is employed for examining the edge region of the silicon wafers. By way of example, the EBI unit from Nanophotonics AG or the RSW1200 from Raytex Corp. is suitable, which not only permit defect detection but also supply information about the edge roughness, cf. FIG. 3.

The functioning of an inspection unit of this type is based on the detection of light in the dark field and/or the recording of images in the bright field. In the dark field mode, light is scattered at so called light point defects (LPD), that is to say for example at crystal defects, damage, scratches, impurities or particles. In this case, each defect is assigned a size equivalent to its light scattering behavior, the so called "Latex Sphere Equivalent" (LSE). In the bright field mode, by contrast, images of the edge are recorded.

In the prior art, by contrast, the wafer edge was usually examined either visually or by imaging measurement systems, the images being assessed by a human in the imaging methods, too. In this case, the resolution of the defects is limited to the abilities of the human eye. Therefore, a high resolution defect analysis and classification based in particular on objective criteria cannot be performed. Consequently, nor was it possible to provide methods for the optimized processing of the edge with the aid of known inspection methods.

Step e) of the method according to the invention involves pretreating the selected silicon wafer in a single wafer epitaxy reactor, wherein, in a first step, a treatment in a hydrogen atmosphere at a flow rate of 1-100 slm is effected and, in addition, in a second step, an etching medium with a flow rate of 0.5-5 slm is added to the hydrogen atmosphere and is distributed in the reactor chamber by means of a gas distribution device.

The state of the wafer edge before the actual epitaxy step is crucial for freedom from defects. Alongside particles, extremely small instances of damage as a result of the epitaxy process can also give rise to growth defects.

In order both to reduce the particle contamination further and to remove small instances of damage possibly present, in particular the wafer edge is subjected to an etching treatment before the beginning of the epitaxy operation. This can, however, be accompanied by a deterioration in the flatness/roughness relative to the polished edge, but this was able to be kept comparatively small in the context of the invention.

This etching treatment is effected in the context of the pretreatment steps provided in the epitaxy reactor. A polished silicon wafer to be epitaxialy coated is usually exposed to a hydrogen atmosphere in order to remove native oxide from the silicon wafer. In a second step, an etching medium is usually added to the hydrogen atmosphere. In this second step, the following process parameters are usually employed in the prior art:
Gas Flow Rates:
HCl: 0.9 slm (standard liter per minute);
$H_2$: typically 50 slm.

If appropriate, the gas flows are distributed in the reactor chamber by means of a so called AMV. Automatic metering valve: I/O=150/150 (prior art: homogeneous distribution of the gas flows).

These values are modified in the method according to the invention to:
Gas Flow Rates:
HCl: 0.5-5 slm, preferably 1.5-5 slm, more preferably 3-5 slm;
$H_2$: 1-100 slm, preferably 1-10 slm, most preferably 5-10 slm.

It has been found that the process parameters chosen lead to an increased etching rate in the edge region of the silicon wafer.

In addition, preferably the I/O value (I=inner zone, O=outer zone), that is to say the distribution of the gas flows, is changed:
automatic metering valve: I/O=0/300-100/200=0-0.5.

The distribution of the gas flows in the reactor chamber is controlled by the automatic metering valve (AMV). For the Epi Centura reactors from Applied Materials, a device called Accusett™ is available, comprising valves ("metering valves"), which permits this. The flow of the etching medium is distributed into an inner zone and into an outer zone of the reactor chamber. The control is preferably effected by means of suitable software.

The etching medium distributed into the inner zone acts on a region around the center of the silicon wafer situated on a susceptor. That part of the etching medium which is distributed into the outer zone of the chamber acts on an outer region of the silicon wafer, that is to say in particular on the edge region. Overall, inner and outer zones correspond overall approximately to the size of the silicon wafer to be treated.

The distribution of the etching medium between inner and outer zones is preferably 0 to a maximum of 0.5. This ratio results from the quantity of etching medium in the inner zone with respect to the quantity of etching medium in the outer zone. The etching medium is thus conducted predominantly into the edge region.

The size of the inner and outer zones relative to the silicon wafer can likewise be controlled, most simply by corresponding arrangement and configuration of the gas inlet devices ("injectors") that conduct the gases into the reactor chamber.

By way of example, the inner zone could be a circular region having a diameter of 75 mm in the center of the silicon wafer, given a wafer diameter of 300 mm, as already described in US 2008/0182397 A1.

In the method according to the invention, the inner zone preferably corresponds to a circle having a diameter of 100 mm in the center of the silicon wafer, while the outer zone corresponds to a ring having a width of 100 mm which encompasses the edge of the silicon wafer. Silicon wafers having a diameter of 300 mm are likewise taken as a basis for these values. With the use of silicon wafers of the next generation, which is currently in development, having a substrate diameter of 450 mm, inner and outer zones are chosen analogously thereto, and likewise in the case of smaller substrates such as 200 mm or 150 mm wafers.

The quantity of the etching medium is preferably realized by altering the diameter of the gas pipelines for inner and outer zones. The quantity of the etching medium is reduced by reducing the line diameter. In principle, the following construction is preferred:

The gas quantity is set by means of a mass flow controller (MFC) that is able to set a flow rate of between 1 slm and 5 slm. This is novel since the MFC used in the prior art was limited to 0.9 slm. This gas quantity is then passed via a main gas line to two needle valves (inner and outer zones) and distributed there. The regulation is effected by the setting of the valves (regulation of the line diameter for inner and outer zones independently of one another). The distributed gas quantities are then introduced into the reactor chamber via an injector. This construction has the advantage that automatic control by means of suitable software is possible.

After the pretreatment steps, the epitaxy step takes place in accordance with f). The epitaxial deposition itself is effected in accordance with the prior art, as described for example in DE 102 005 045 337 A1. The resulting epitaxially coated silicon wafer is characterized by a surface roughness in the edge region of 0.1-1.5 nm RMS relative to a spatial wavelength range of 10-80 $\mu$m and a variation of the surface roughness of 1-10%.

Figure 5:
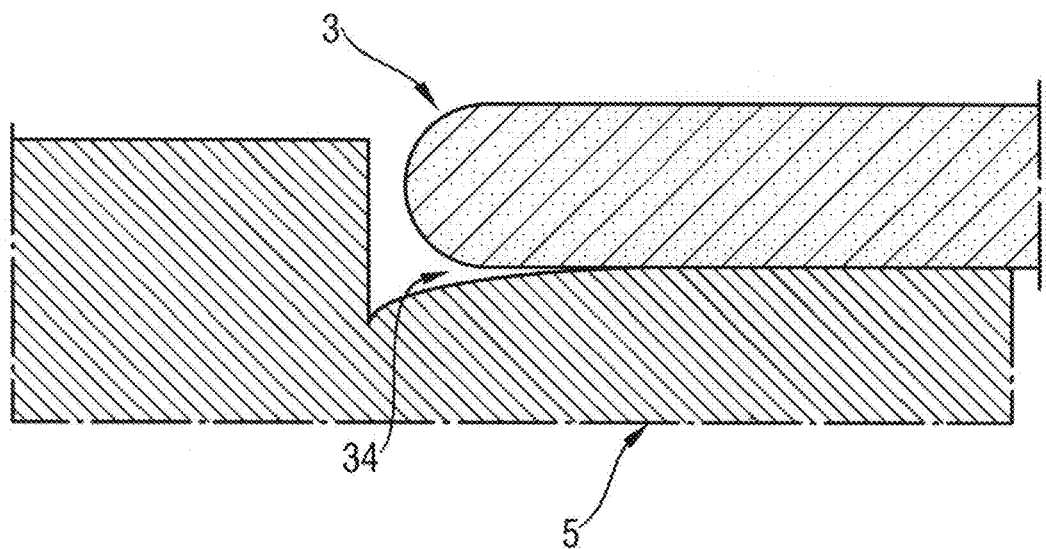
FIGS. 5 and 6 show a wafer on a susceptor/wafer support.
Figure 6:
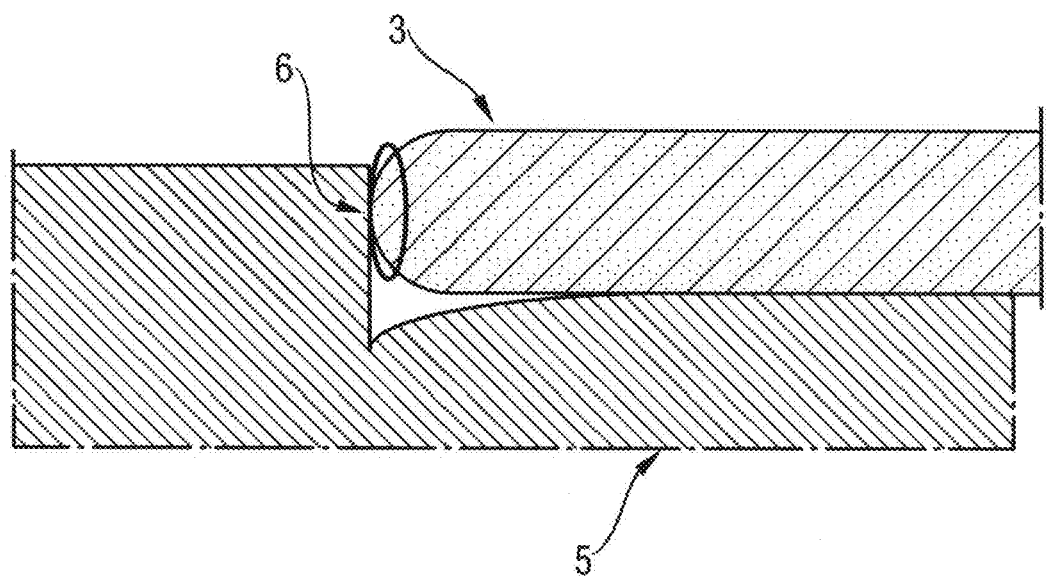
Figure 7A:
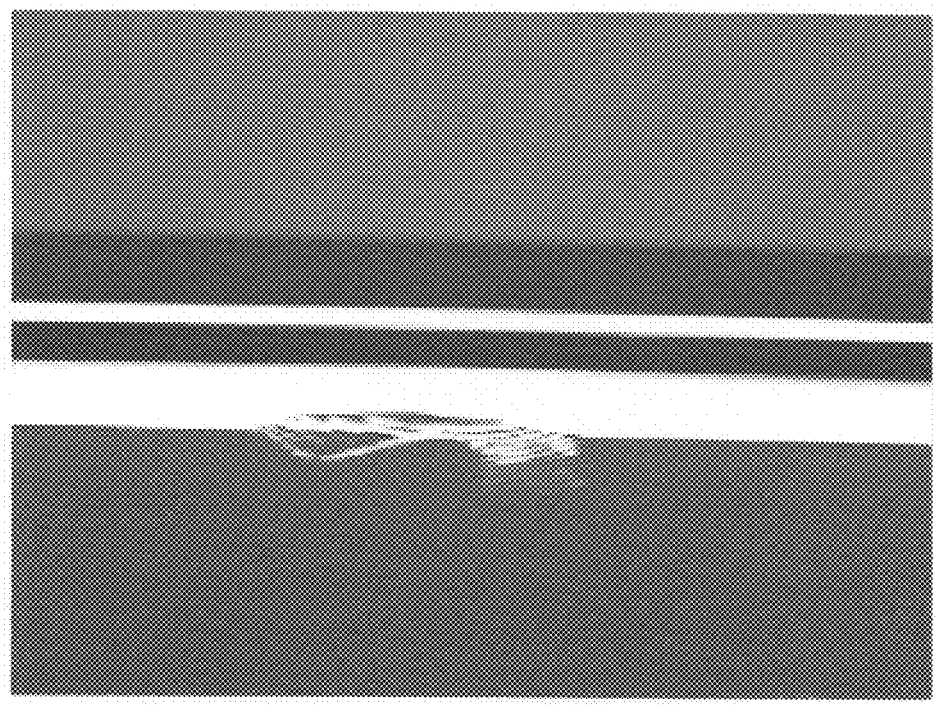
FIG. 7 shows micrographs of different defect types.
Figure 7B:
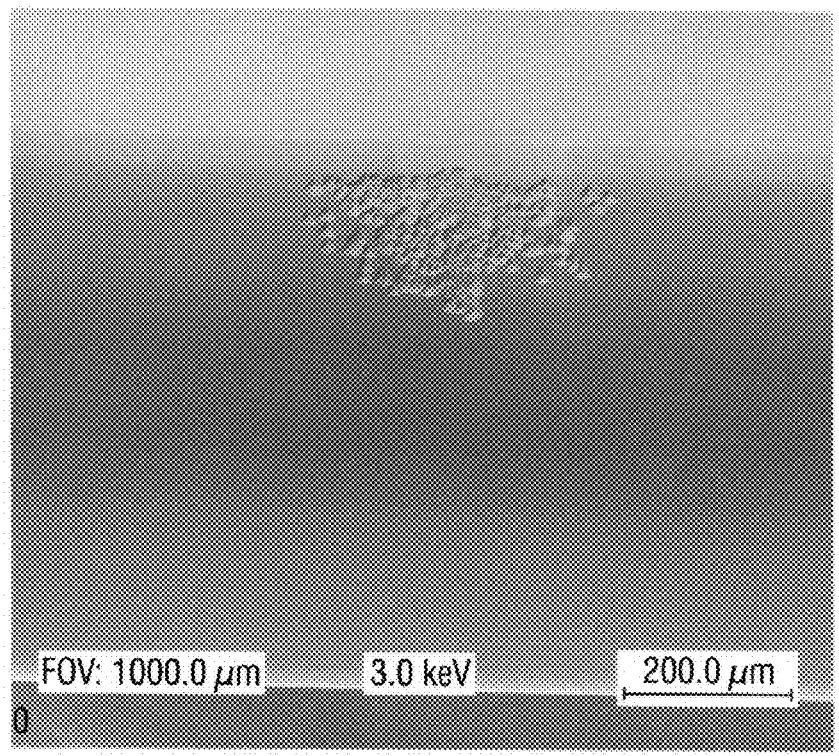
Figure 7C:
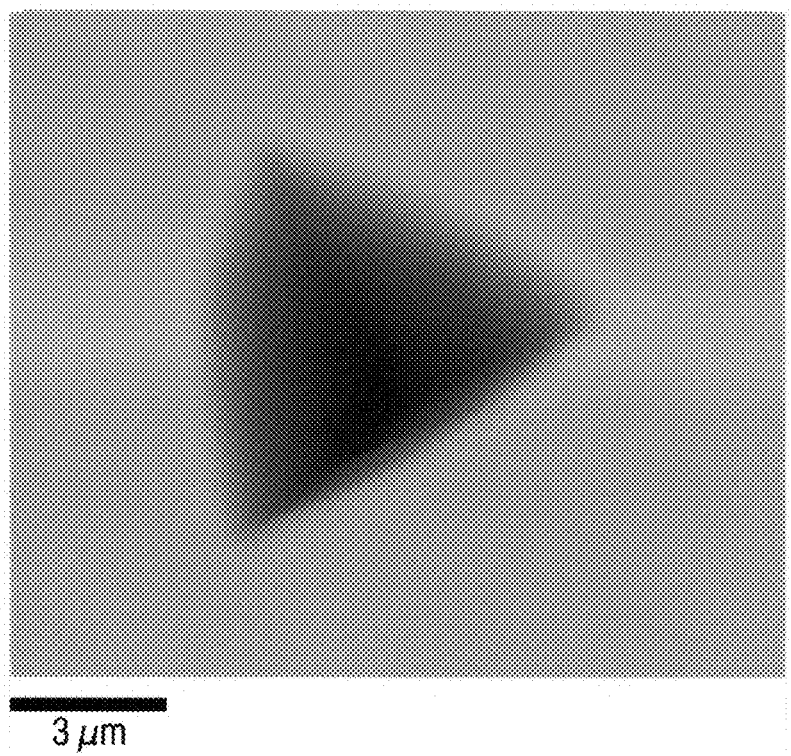
Figure 7D:
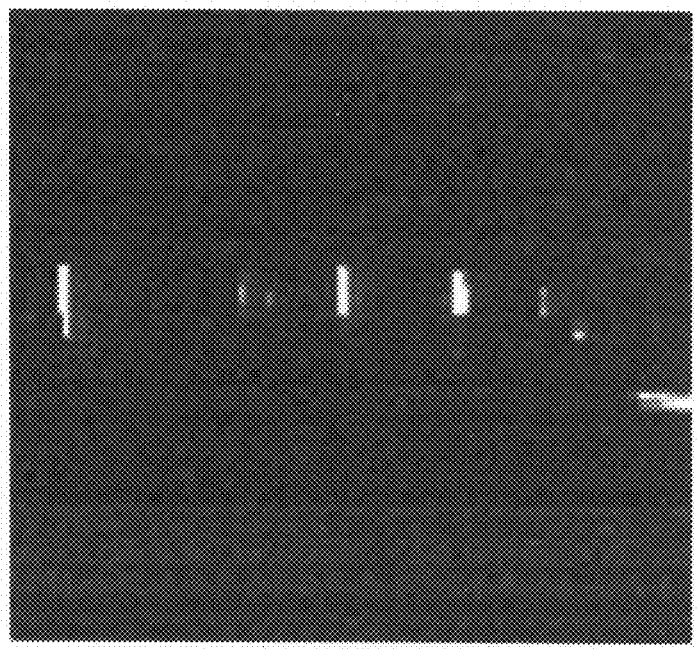
Figure 7E:
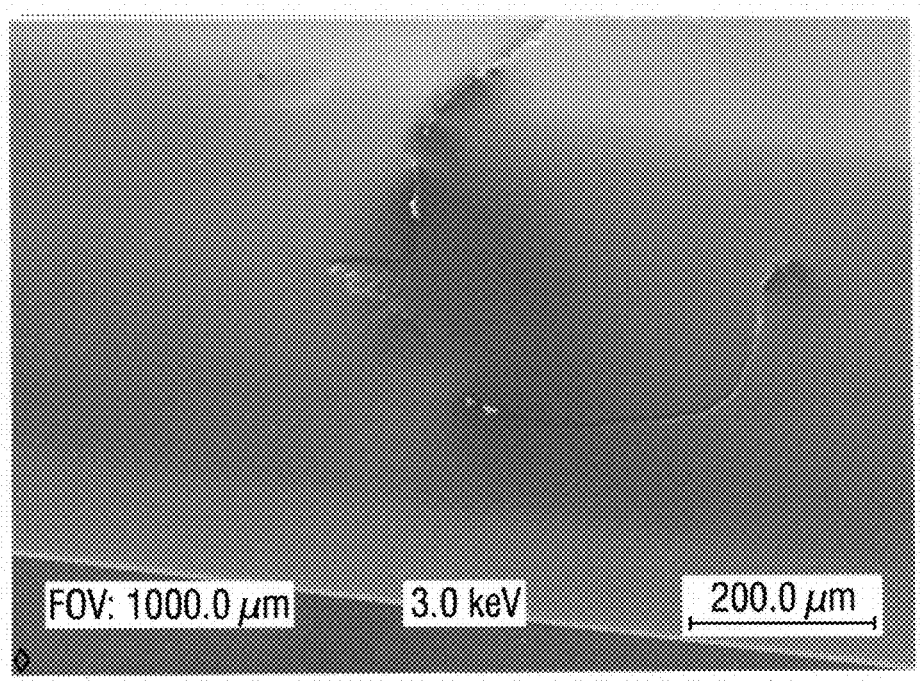

Furthermore, an optimized susceptor support is preferably used in order to significantly reduce susceptor impressions. This is illustrated in FIGS. 5 and 6. The wafer support 5 is constructed in such a way that the wafer 3 does not bear on the rear side in the edge region 34 and susceptor impressions are thereby completely avoided. Alongside the support itself, the handling of the wafers is monitored by the automatic edge inspection and defect classification. If the wafer 3 is not placed on the susceptor 6 in a centered manner and touches at the edge 6, then this is identified by the measurement and a correction of the placement position of the handling robot is immediately effected.

Preferably, the epitaxial coating is followed by a renewed examination of the edge region of the silicon wafer with regard to defects and edge roughness.

Various defect types are known with regard to the defects on epitaxialy coated silicon wafers. Defects can ultimately be classified into specific defect classes. By way of example, there is the possibility of classifying the defects of one type in size classes and utilizing them as an additional quality and specification feature.

Examples of defect types and associated size classes which are accessible to an automatic edge inspection in accordance with the method according to the invention are presented below in Table 1. Defects having length/size/extent>1 $\mu$m are detected. Where such defect types can occur in wafer fabrication is also presented.

TABLE 1

| TYPE | CLASS | FEATURE | OCCURRENCE |
| --- | --- | --- | --- |
| Scratch | max. permitted scratch length | >1 $\mu$m | Edge rounding, edge polishing, handling |
| Spalling | max. permitted size of spalling (extent) | >1 $\mu$m | Edge rounding, edge polishing, handling |
| Structural epitaxial defect | max. permitted size/extent | >1 $\mu$m | Epitaxy: e.g. stacking faults, hillock, spike |
| Crack | max. permitted length | >1 $\mu$m | Handling, epitaxy |
| Blemish | max. permitted extent | >1 $\mu$m | Handling, epitaxy |
| Susceptor impression | max. permitted extent | >1 $\mu$m | Epitaxy |

FIGS. 7 *a*)-*e*) show examples of defect types from table 1 in the form of microscope micrographs: FIG. 7*a*) spalling, FIG. 7*b*) a blemish, FIG. 7*c*) a structural epitaxy defect, FIG. 7*d*) a scratch, FIG. 7*e*) a crack. Alongside defect type and defect class, the position of the defect is also available as quality information.

It is thus possible, given corresponding specification, to distinguish e.g. between defects on the apex, the upper or lower facet and the upper or lower 3 mm edge region of the silicon wafer and, in a targeted manner, to sort out and, if appropriate, reprocess wafers having defects on the apex (cf. FIG. 4). The customer's desire to obtain exclusively wafers having a defect free apex can therefore be complied with.

Finding suitable process parameters in the pretreatment in the epitaxy reactor was crucial for the success of the method according to the invention. Further advantages are afforded as a result of improved handling of the silicon wafer in the epitaxy reactor (cf. FIG. 5 and FIG. 6), ensuring that the silicon wafer is free of contamination before the epitaxy step by a special cleaning method (cf. FIG. 4). Consequently, in conjunction with the evaluation of the data of the edge inspection as explained below, it was possible to provide epitaxially coated silicon wafers having extremely low roughness in the edge region and at the same time to ensure that wafers having defects in the edge region of the silicon wafer are on no account supplied to customers.

A method was developed for generating information about the roughness of the wafer edge from the raw data of a measurement system for automatic edge inspection. For this purpose, the data recorded by CCD cameras were filtered with regard to the background signal generated by the inspected material, normalized and analyzed. The processing of the CCD raw signals ends in a GV (gray value) parameter (called P4 hereinafter), which can be used to describe roughness properties of the edge. The P4 parameter ultimately describes the detected light intensity in a camera pixel. Typically as is customary in camera technology—256 gray value levels are available for classifying the intensity. This light intensity is in turn proportional to the roughness of the wafer edge at the respective position.

Figure 2:
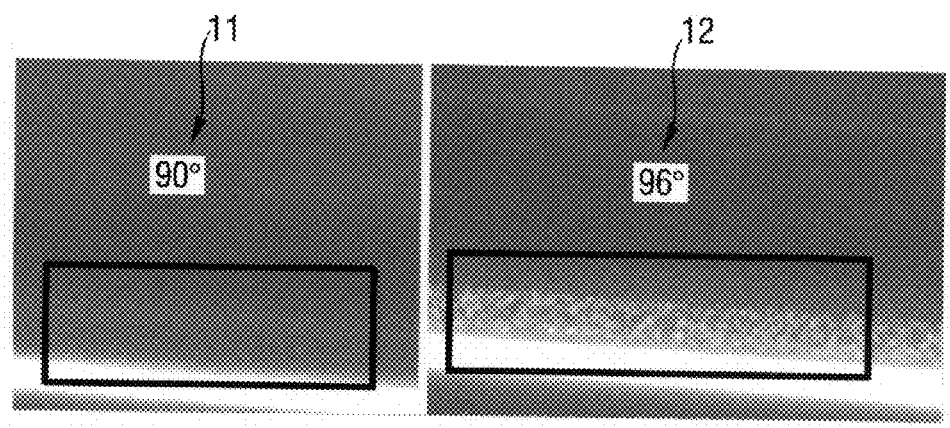
FIG. 2 shows microscope micrographs of regions on a wafer which lead to different P4 values.
Figure 3:
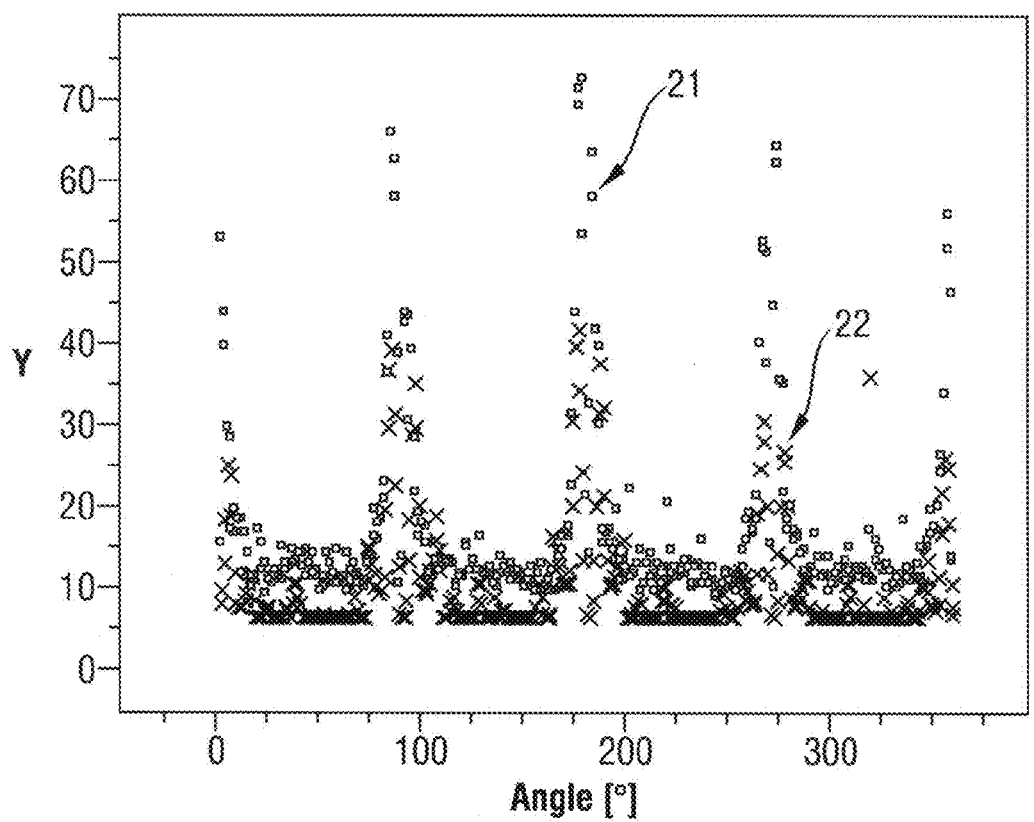
FIG. 3 shows the correlation of P4 value and roughness.

FIG. 1 illustrates the gray value level P4 as a function of the angle (position) on the silicon wafer. Two peaks can be seen. Different signal magnitudes are observed at the positions 11 and 12. FIG. 2 shows microscope micrographs of the regions that caused different P4 signal magnitudes 11 and 12 in FIG. 1. The P4 parameter is suitable for describing both absolute values of the roughness and the homogeneity of the roughness over the edge of a wafer. FIG. 3 shows the correlation of the P4 value 22 to roughness values 21, which in the present case were determined with the aid of the standard method of Normaski interference (optical roughness measurement).

On the basis of the evaluation of the P4 signals and the roughness values correlated therewith, it was possible to perform process optimizations during the edge polishing with regard to homogeneity of the edge roughness (<3% variation) and absolute value of the roughness<1 nm RMS 10/80 µm, to monitor the edge polishing process, if necessary to readjust the edge polishing equipment and to sort out/rework wafers unsuitable for subsequent processes.

The process parameters disclosed were tested in a test matrix and the processed wafers were measured on a fully automatic edge inspection system. On the basis of the data generated it was able to be ascertained that for more than 95% of the processed wafers the entire edge region contains e.g. fewer than 100 defects having a size of less than 1 µm LSE, and the defect types as described in Table 1 were able to be eliminated.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An epitaxially coated silicon wafer having a front side, a rear side and an edge region comprising a rounded and polished edge of the silicon wafer and also a region adjacent to the edge and having a width of 3 mm on the front and rear sides, having a surface roughness in the edge region of 0.1-1.5 nm RMS relative to a spatial wavelength range of 10-80 µm, and a variation of the surface roughness of 1-10%.

2. A silicon wafer having a front side, a rear side and an edge region comprising a rounded and polished edge of the silicon wafer and also a region adjacent to the edge and having a width of 3 mm on the front and rear sides, having a surface roughness in that edge region of 0.1-0.8 nm RMS relative to a spatial wavelength range of 10-80 µm, and a variation of the surface roughness of 1-3%.

3. A method for producing an epitaxially coated silicon wafer, comprising the following sequential process steps: (a) providing a group of silicon wafers having rounded edges; (b) polishing the edges of the silicon wafers; (c) cleaning the silicon wafers; (d) examining the edge regions of the group of silicon wafers with regard to defects and edge roughness and selecting silicon wafers from the group of silicon wafers which have a surface roughness of less than 1 nm RMS relative to a spatial wavelength range of 10-80 µm; (e) individually pretreating the selected silicon wafers in a single wafer epitaxy reactor, wherein, in a first step, a treatment in a hydrogen atmosphere at a flow rate of 1-100 slm is effected and, in addition, in a second step, an etching medium with a flow rate of 0.5-5 slm is added to the hydrogen atmosphere and is distributed in the reactor chamber by means of a gas distribution device; and (f) epitaxially coating the silicon wafer.

4. The method of claim 3, wherein providing a group of silicon wafers in accordance with step a) is effected by slicing the wafers from a silicon single crystal, rounding the edges of the silicon wafers and grinding or lapping the front and rear sides thereof.

5. The method of claim 3, wherein the silicon wafer selected in step d) comprises a front side, a rear side and an edge region comprising a rounded and polished edge of the silicon wafer and also an extended region adjacent to the edge and having a width of in each case 3 mm on the front and rear sides, and also has a surface roughness in that edge region of 0.1-0.8 nm RMS relative to a spatial wavelength range of 10-80 µm and also a variation of the surface roughness of 1-3%.

6. The method of claim 5, wherein the selected silicon wafers have in the edge region no defects having an extent of greater than 1 µm.

7. The method of claim 3, wherein cleaning in step c) comprises cleaning with aqueous hydrofluoric acid (HF), cleaning with TMAH/$H_2O_2$ (tetramethylammonium hydroxide/hydrogen peroxide), and rinsing with ultrapure water.

8. The method of claim 3, wherein the silicon wafers are cleaned by means of a cleaning solution comprising ultrapure water, tetramethyl ammonium hydroxide (TMAH) and hydrogen peroxide ($H_2O_2$).

9. The method of claim 8, wherein the cleaning in step c) is effected by the wafer being moved relative to cleaning rollers while wafer and/or cleaning rollers are flushed with the cleaning solution.

10. The method of claim 9, wherein the cleaning rollers are synthetic sponges.

11. The method of claim 3, wherein during pretreatment in the epitaxial reactor, the gas flows introduced into the reactor chamber by injectors are distributed into an outer zone and an inner zone of the reactor chamber by means of valves, such that the gas flow in the inner zone acts on a region around the center of the silicon wafer and the gas flow in the outer zone acts on an edge region of the silicon wafer, wherein during the second pretreatment step with addition of an etching medium to the hydrogen atmosphere, the distribution of the etching medium in inner and outer zones is I/O=0-0.5.

12. The method of claim 3, wherein the two pretreatment steps in accordance with step e) are in each case effected in a temperature range of 950 to 1200° C.

13. The method of claim 3, wherein the etching medium added to the hydrogen atmosphere is hydrogen chloride.

14. The method of claim 3, wherein during the first pretreatment step, the hydrogen flow rate is 40-60 slm.

15. The method of claim 3, wherein during both pretreatment steps in step e), the duration of the pretreatment is 10-120 s.

16. The method of claim 15, wherein during both pretreatment steps, the duration of the pretreatment is 20-60 s.

17. The method of claim 3, wherein the flow rate of the etching medium in the second step of the pretreatment in step e) is 1.5-5 slm.

18. The method of claim 3, wherein the flow rate of the etching medium in the second step of the pretreatment in step e) is 3-5 slm.

19. The method of claim 3, wherein the hydrogen flow rate in the second step of the pretreatment in step e) is 1-10 slm.

20. The method of claim 3, wherein the hydrogen flow rate in the second step of the pretreatment in step e) is 5-10 slm.

* * * * *